US008188479B2

(12) United States Patent
Liu

(10) Patent No.: US 8,188,479 B2
(45) Date of Patent: May 29, 2012

(54) PIXEL ELECTRODE STRUCTURE HAVING VIA HOLES DISPOSED ON COMMON LINE WITH HIGH DISPLAY QUALITY

(75) Inventor: Chih-Chung Liu, Guangdong (CN)

(73) Assignee: Century Display(Shenzhen)Co., Ltd., Longhua, Baoan, Shen-zhen, Guangdong (CN)

( * ) Notice: Subject to any disclaimer, the term of this patent is extended or adjusted under 35 U.S.C. 154(b) by 77 days.

(21) Appl. No.: 12/868,752

(22) Filed: Aug. 26, 2010

(65) Prior Publication Data

US 2010/0320472 A1      Dec. 23, 2010

Related U.S. Application Data

(63) Continuation of application No. PCT/CN2009/072496, filed on Jun. 26, 2009.

(30) Foreign Application Priority Data

Apr. 3, 2009   (CN) .......................... 2009 1 0038396

(51) Int. Cl.
*H01L 29/04* (2006.01)
(52) U.S. Cl. ........ 257/60; 257/59; 257/72; 257/E27.131
(58) Field of Classification Search .................... 257/59, 257/60, 72, E27.131
See application file for complete search history.

(56) References Cited

U.S. PATENT DOCUMENTS

| 5,550,066 | A | * | 8/1996 | Tang et al. ...................... 438/29 |
| 5,982,462 | A | * | 11/1999 | Nakano et al. ................... 349/43 |
| 2007/0024793 | A1 | * | 2/2007 | Yoo et al. ....................... 349/141 |
| 2009/0206339 | A1 | * | 8/2009 | Park et al. ....................... 257/59 |

* cited by examiner

*Primary Examiner* — Thanh V Pham
(74) *Attorney, Agent, or Firm* — Winston Hsu; Scott Margo

(57) ABSTRACT

A pixel electrode structure includes a transparent substrate, a data line, a common line, a first array pixel, and a second array pixel disposed on the transparent substrate. The first/second array pixels respectively include a thin film transistor, a pixel electrode, and a gate line, and the common line is disposed at a lateral side of the gate line. A first via hole and a second via hole are respectively disposed on common line and in contact with an extending portion of the first thin film transistor and an extending portion of the second thin film transistor. A dummy line is disposed at a side of the data line, and a third via hole is disposed both on the dummy line and on the common line. The present invention can not only increase the aperture ratio of the pixel, but have a better stability of the common voltage signal.

13 Claims, 11 Drawing Sheets

PIXEL ELECTRODE STRUCTURE HAVING VIA HOLES DISPOSED ON COMMON LINE WITH HIGH DISPLAY QUALITY

CROSS REFERENCE TO RELATED APPLICATIONS

This application is a continuation of International Application No. PCT/CN2009/072496 filed on Jun. 26, 2009.

BACKGROUND OF THE INVENTION

1. Field of the Invention

The present invention relates to a pixel electrode structure, and more particularly, to a pixel electrode structure with high display quality.

2. Description of the Prior Art

Please refer to FIG. 1. In a conventional active matrix type liquid crystal display (LCD), each pixel of a single-gate circuit structure includes a thin-film transistor 10. A gate electrode of the thin film transistor 10 is connected to a horizontal gate line 12, a source electrode of the thin film transistor 10 is connected to a vertical data line 14, and a drain electrode of the thin film transistor 10 is connected to a pixel electrode. Each thin film transistor 10 in a same row is connected to a different data line 14.

In the following, a basic method of operating the conventional single-gate circuit structure is described. Each thin film transistor 10 in a same horizontal row has a gate electrode electrically connected to a same gate line 12, such that the gate electrodes are also electrically connected to each other. Thus, voltages applied to the gate electrodes of the thin film transistors electrically connected to the same gate line 12 are approximately equal, and are changed together. If a sufficiently large positive voltage is applied to a gate line 12, all thin film transistors 10 connected to the gate line 12 will be turned on. The pixel electrodes disposed along the gate line 12 are electrically connected to corresponding vertical data lines 14, and corresponding data signals are transferred into the vertical data lines 14 to charge the corresponding pixel electrodes to appropriate voltages. Next, a sufficiently large negative voltage is applied to the gate electrodes to turn off the thin film transistors 10. During the period when the thin film transistors 10 are turned off, the electric charges of the data signals are thus stored in the liquid crystal capacitors until next data signals are to be written. The next horizontal gate line 12 is then turned on, and the corresponding data signals are transferred into the corresponding data lines 14. As a result, the data signals of a whole frame can be written into the thin film transistors 10 in sequence according to the aforementioned method. Thereafter, the process of transferring the data signals can start again from the first gate line.

Because number of the plurality of data lines 14 is high, and the number of expensive source chips used is increasing accordingly, cost of the display panel is high in the aforementioned single-gate circuit structure. In order to reduce the cost, a dual-gate circuit structure is provided, as shown in FIG. 2. Each pair of adjacent columns of thin film transistors 16 share a same data line 18, so that the number of the data lines 18 can be reduced, and the number of the source chips can be accordingly reduced. Therefore, the manufacturing cost of the display panel is reduced due to the number of source chips used by the display panel being reduced. In addition, a dummy line 20 is disposed between each two adjacent data lines 18 to reduce crosstalk resulting from electromagnetic interference (EMI) caused in pixels corresponding to the two adjacent columns between the two adjacent data lines 18 in the display panel. The dummy line 20 receives a data signal having polarity opposite that of the data line 18, to improve display quality of the panel.

As shown in FIG. 3, in the circuit layout of the aforementioned prior art, a common line 22 is an opaque metal layer disposed under an electrode layer 24 in a transmissive region. Due to the common line 22 partially shielding the electrode layer 24, area of the transmissive region of an electrode layer 24 is reduced, and aperture ratio of the whole display panel is reduced.

SUMMARY OF THE INVENTION

It is one of the objectives of the present invention to provide a pixel electrode structure with high display quality by disposing the common line between the adjacent gate lines to reduce the number of the common lines and to raise the aperture ratio of the pixel in the display panel.

It is another one of the objectives of the present invention to provide a pixel electrode structure with high display quality by connecting the common line to the dummy line to have a better stability of the common voltage signal. When the data line is disconnected, a method of laser repairing can be performed to detour the data line to the dummy line for enhancing yields.

According to a preferred embodiment of the present invention, a pixel electrode structure with high display quality is provided. The pixel electrode structure includes a transparent substrate. A data line, a common line, a first array pixel, and a second array pixel are disposed on the transparent substrate. The first array pixel includes a first thin film transistor, a first pixel electrode, and a first gate line. The common line is disposed at a lateral side of the first gate line. The second array pixel includes a second thin film transistor, a second pixel electrode, and a second gate line. The common line is also disposed at a lateral side of the second gate line. In addition, a first via hole and a second via hole are respectively disposed on common line and in contact with an extending portion of the first thin film transistor and an extending portion of the second thin film transistor. A dummy line is disposed at a side of the data line, and a third via hole is disposed on both the dummy line and the common line.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
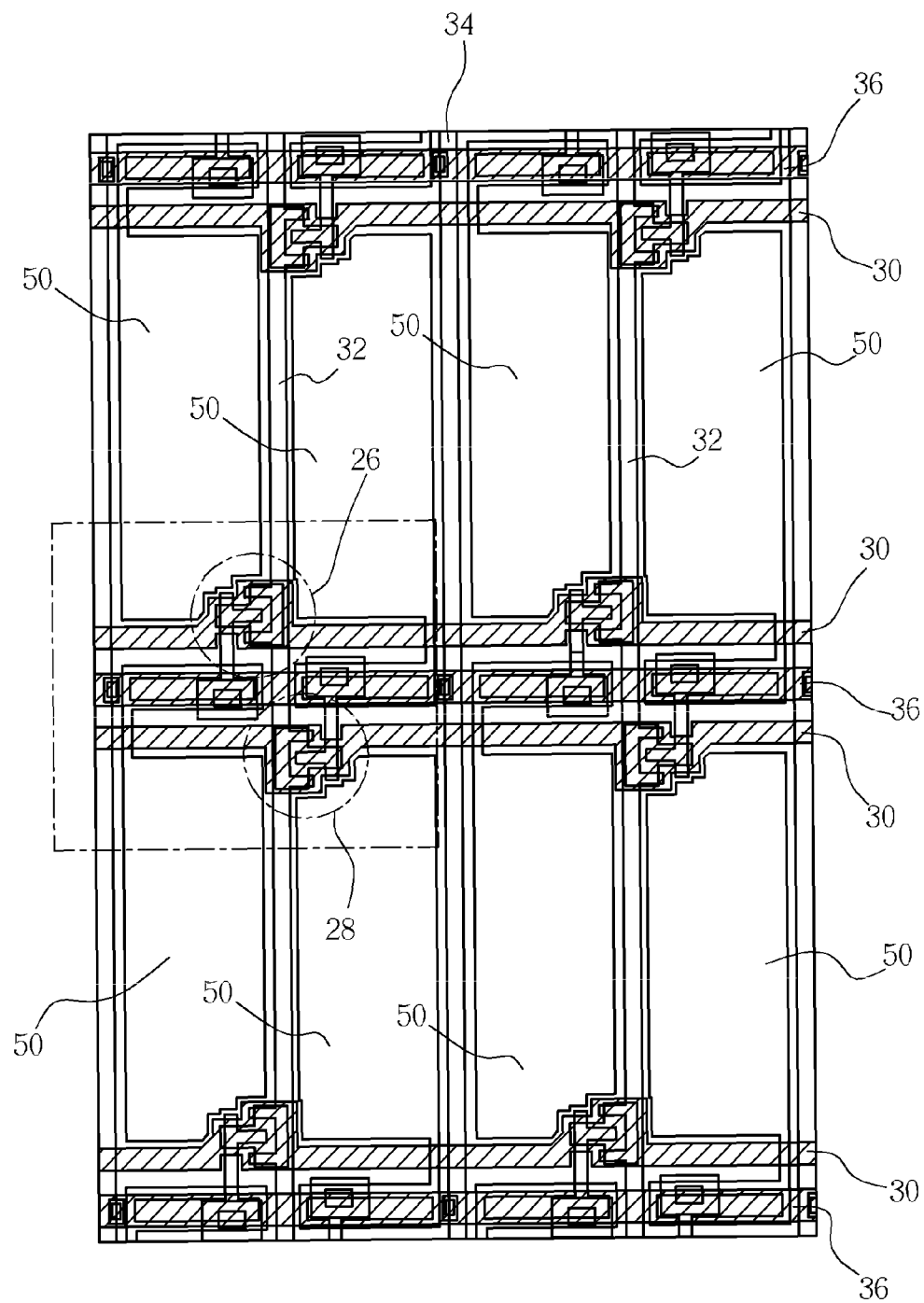
FIG. 4 is a schematic diagram illustrating a circuit layout structure of the liquid crystal display panel according to a first embodiment of the present invention.
Figure 5:
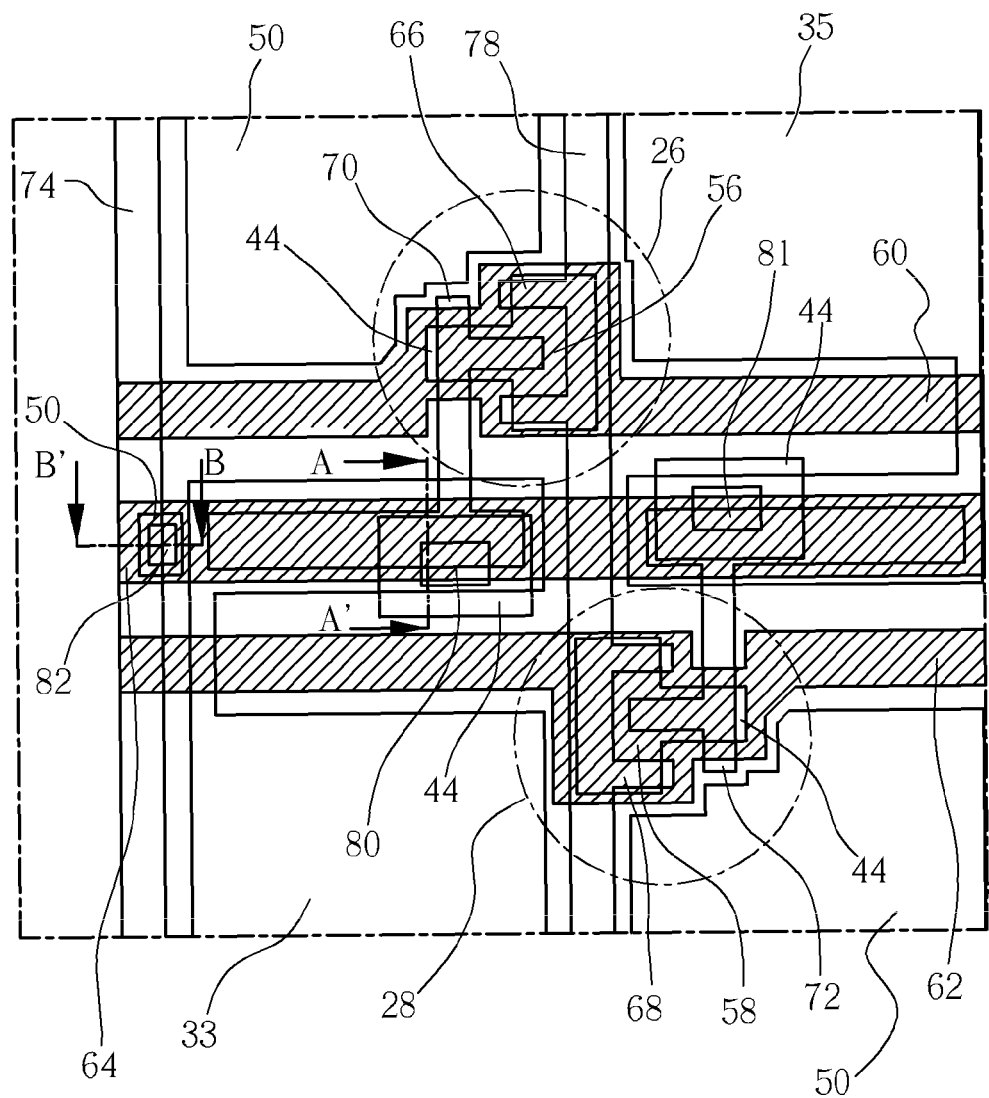
FIG. 5 is a sectional enlarged schematic diagram illustrating a circuit layout structure of the liquid crystal display panel according to a first embodiment of the present invention.

In the liquid crystal display panel of the present invention, a pixel electrode structure with high displaying quality by connecting a dummy line to a common line, wherein the common line is connected to a common electrode. Please refer to a circuit layout of a liquid crystal display panel according to a first embodiment shown in FIG. 4 and FIG. 5. FIG. 5 is an enlarged schematic diagram of a pixel electrode structure marked by a dotted block shown in FIG. 4. Components in the dotted block include two pixel electrodes formed by an electrode layer 50, two thin film transistors 26, 28 and a circuit layout surrounding the thin film transistors 26, 28. The pixel electrode structure in the dotted block in FIG. 4 is taken as a unit, and the pixel electrode structures are connected to each other through gate lines 30, data lines 32, dummy lines 34, and common lines 36. Because the pixel electrode structures on the display panel are arranged in a matrix, the pixel electrode structures in a same column share the same data line 32 and the same dummy line 34, and the pixel electrode structures in a same row share the same gate line 30 and the same common line 36. The connecting relations and the relative positions of all components in each pixel electrode structure are the same, and one pixel electrode structure is taken as an example in the following description.

Figure 6:
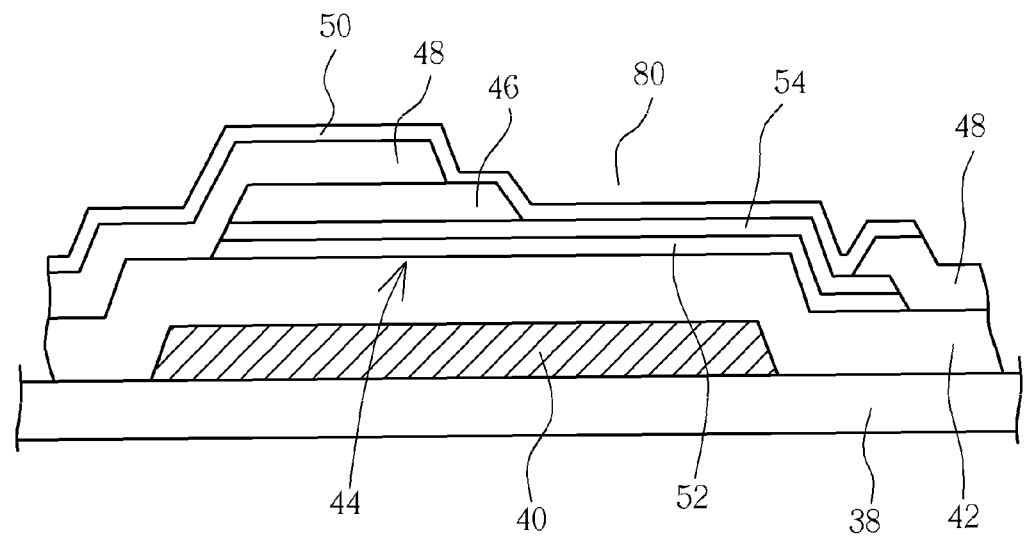
FIG. 6 is a cross-sectional view of the circuit layout structure, taken along a line A-A' of FIG. 5.

In order to describe embodiments clearly, please refer to FIG. 5 and FIG. 6 together in the following description. FIG. 6 is a cross-sectional view of the circuit layout structure, taken along a line A-A' of FIG. 5, and FIG. 6 may represent stacking relationships of the components in FIG. 5. FIG. 5 shows a pixel electrode structure including a transparent substrate 38, a first array pixel, and a second array pixel disposed on the transparent substrate 38. The first array pixel includes a first thin film transistor 26, a first pixel electrode 33 and a first gate line 60, and the second array pixel includes a second thin film transistor 28, a second pixel electrode 35 and a second gate line 62. The first array pixel and the second array pixel are formed by a first metal layer 40, an insulating layer 42, a semiconductor layer 44, a second metal layer 46, a passivation layer 48 and an electrode layer 50. The insulating layer 42 and the passivation layer 48 include an insulating material. The insulating material of the passivation layer 48 and the insulating layer 42 includes silicon nitride. A material of the electrode layer 50 includes indium tin oxide (ITO). The first pixel electrode 33 and the second pixel electrode 35, which are respectively connected to the first thin film transistor 26 and the second thin film transistor 28, are formed by the electrode layer 50.

The first metal layer 40 is disposed on the transparent substrate 38 to form a first gate electrode 56 of the first thin film transistor 26, a second gate electrode 58 of the second thin film transistor 28, a first gate line 60, a second gate line 62 and a common line 64 disposed between the first gate line 60 and the second gate line 62. When the first metal layer 40 is formed, the first gate line 60 is formed to be connected to the gate electrode 56 of the first thin film transistor 26, and the second gate line 62 is formed to be connected to the gate electrode 58 of the second thin film transistor 28. After forming the first metal layer 40, the insulating layer 42 is formed on the first metal layer 40, and the insulating layer 42 disposed on the gate electrode 56 of the first thin film transistor 26 and disposed on the gate electrode 58 of the second thin film transistor 28 respectively serves as a gate insulating layer. The semiconductor layer 44 is disposed on the insulating layer 42, and the semiconductor 44 includes a two-layer structure with a top layer and a bottom layer. The bottom layer is an amorphous silicon (a-Si) layer 52, and is directly disposed on the insulating layer 42. The top layer is an ohmic contact layer 54 of the amorphous silicon doped with n-type doping ($n^+$a-Si). A second metal layer 46 is disposed on the ohmic contact layer 54 and on the insulating layer 42 to form a source electrode 66 and a drain electrode 70 of the first thin film transistor 26, a source electrode 68 and a drain electrode 72 of the second thin film transistor 28, a data line 78, and a dummy line 74 between the two data lines 78. The data line 78 connects the source electrode 66 of the first thin film transistor 26 and the source electrode 68 of the second thin film transistor 28, and the first thin film transistor 26 and the second thin film transistor 28 are disposed at two opposite sides of the data line 78. The first thin film transistor 26 is disposed at one lateral side of the first gate line 60 and the second gate line 62, and the second thin film transistor 28 is disposed at the other lateral side of the first gate line 60 and the second gate line 62 opposite the one lateral side of the first gate line 60 and the second gate line 62. The source electrode 66 and the drain electrode 70 of the first thin film transistor 26 are disposed on the gate electrode 56 of the first thin film transistor 26, and the source electrode 68 and the drain electrode 72 of the second thin film transistor 28 are disposed on the gate electrode 58 of the second thin film transistor 28. The amorphous layer 52 and the ohmic contact layer 54 are disposed under the source electrode 66 and the drain electrode 70 of the first thin film transistor 26 and the source electrode 68 and the drain electrode 72 of the second thin film transistor 28. The dummy line 74 and the data line 78 are disposed parallel to each other, and the dummy line 74 and the data line 78 are perpendicular to the common line 64, the first gate line 60 and the second gate line 62.

Furthermore, according to FIG. 5, the first pixel electrode 33 is disposed at a lateral side of the second gate line 62, and overlaps the common line 64 and the second gate line 62 respectively to form a corresponding first overlapping area and a second overlapping area. The second overlapping area disposed at one lateral side of the common line 64 is less than the first overlapping area between the first gate line 60 and the second gate line 62. The second pixel electrode 35 is disposed at a lateral side of the first gate line 60, and overlaps the common line 64 and the first gate line 60 respectively to form a third overlapping area and a fourth overlapping area. The fourth overlapping area disposed at the other lateral side of the common line 64 is less than the third overlapping area between the first pixel electrode 60 and the second pixel electrode 62.

Figure 7:
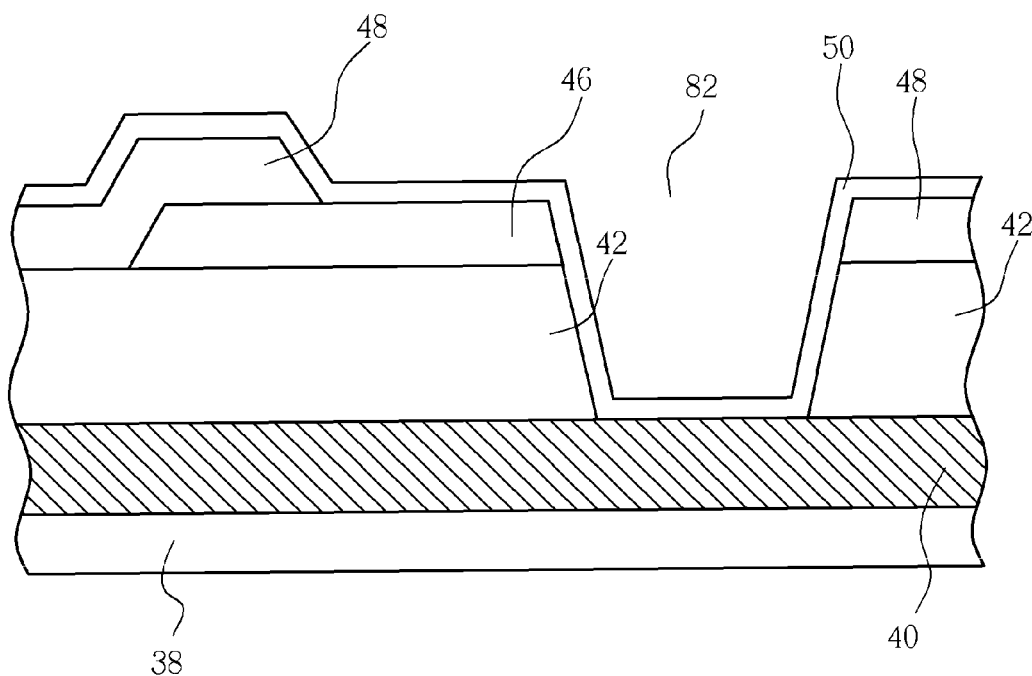
FIG. 7 is a cross-sectional view of the circuit layout structure, taken along a line B-B' of FIG. 5.

Please refer to FIG. 5, FIG. 6, and FIG. 7 together in the following description. FIG. 7 is a cross-sectional view of the circuit layout structure, taken along a line B-B' of FIG. 5. The ohmic contact layer 54 and the second metal layer 46 are covered with the passivation layer 48. The passivation layer 48 has a first via hole 80 and a second via hole 81 that are respectively disposed on both a portion of the drain electrode 70 and a portion of the semiconductor layer 44 of the first thin film transistor 26, and disposed on both a portion of the drain electrode 72 and a portion of the semiconductor layer 44 of the second thin film transistor 28, and the passivation layer 48 has a third via hole 82 disposed on both a portion of the dummy line 74 and a portion of the common line 64. A portion of the dummy line 74 is covered with the passivation layer 48, and the insulating layer 42 disposed thereunder is penetrated through by the third via hole 82. When the passivation layer 48 is etched to form the first via hole 80 and the second via hole 81, the semiconductor layer 44 and the insulating layer 42 corresponding to the first via hole 80 and the second via hole 81 can not be etched through. Accordingly, depth of the first via hole 80 and depth of the second via hole 81 may only reach the semiconductor layer 44. The first via hole 80 is the unconnected part of the passivation layer 48 shown in the cross-sectional view of FIG. 6, and the third via hole 82 is the unconnected part of the passivation layer 48 and the unconnected part of the insulating layer 42 shown in the cross-sectional view of FIG. 7.

The electrode layer 50 is disposed on the passivation layer 48. The electrode layer 50 may be in contact with the drain electrode 70 and the semiconductor layer 44 of the corresponding first thin film transistor 26 through the first via hole 80. The electrode layer 50 may also be in contact with the drain electrode 72 and the semiconductor layer 44 of the corresponding second thin film transistor 28 through the second via hole 81. And, the electrode layer 50 may further be in contact with the dummy line 74 and the common line 64 through the third via hole 82. As shown in FIG. 6, due to the first via hole 80, the second metal layer 46 (regarded as the drain electrode 70) and the semiconductor layer 44 are exposed, and can be in contact with the electrode layer 50. As shown in FIG. 7, due to the third via hole 82, the second metal layer 46 (regarded as the dummy line 74) and the first metal layer 40 (regarded as the common line 64) are also exposed, and both can be in contact with the electrode layer 50. The electrode layer 50 here is an independent electrode layer. The independent electrode layer may electrically connect the dummy line 74 to the common line 64.

In addition, a portion of the electrode layer 50 is in contact with the drain electrode of the thin film transistor, and an overlapping part of the portion of the electrode layer 50, the first metal layer 40, and the second metal layer 46 forms a storage capacitor. For example, an overlapping part of a portion of the drain electrode 70 extending to the common line 64, the common line 64, and the electrode layer 50 forms a storage capacitor of the first thin film transistor 26. Also, an overlapping part of a portion of the drain electrode 72 of the second thin film transistor 28 extending to the common line 64, the common line 64, and the electrode layer 50 forms a storage capacitor of the second thin film transistor 28.

Furthermore, the electrode layer 50 at the lateral side of the first thin film transistor 26 does not overlap the first gate line 60 which is disposed at the lateral side of the drain electrode 70 of the first thin film transistor 26. The electrode layer 50 at the lateral side of the second thin film transistor 28 does not overlap the second gate line 62 which is disposed at the lateral side of the drain electrode 72 of the second thin film transistor 28. As a result, a light-shielding layer, such as black matrix, may be disposed between the color filters corresponding to the edge of the electrode layer at the lateral side of each thin film transistor. Light leakage induced by misalignment of liquid crystal molecules near the edge of each pixel will be shielded by the light-shielding layer when the display panel is utilized to form a liquid crystal display device. Accordingly, the adjacent pixels will not have color crosstalk.

Figure 3:
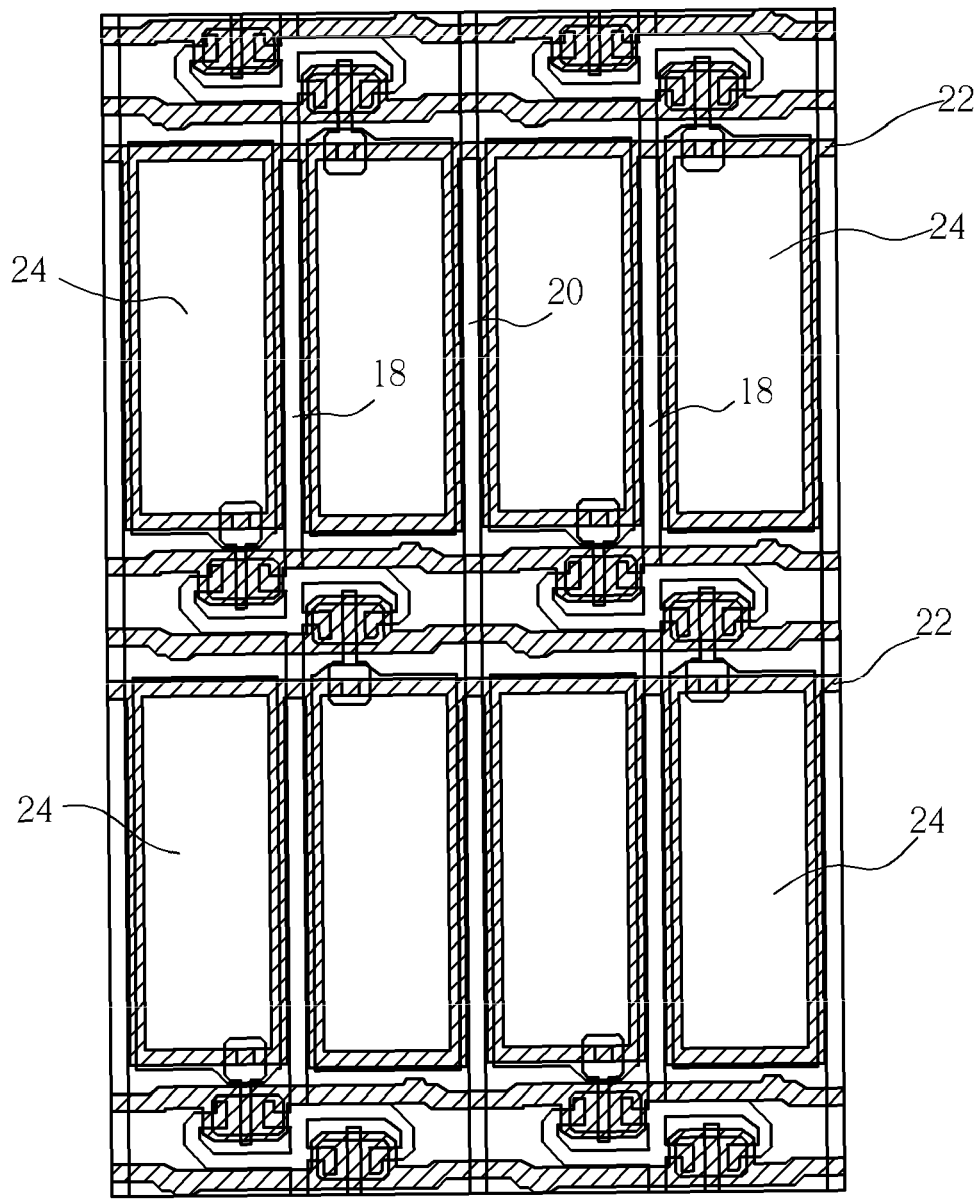
FIG. 3 is a schematic diagram illustrating a circuit layout structure of the display panel according to the prior art.

As shown in FIG. 4, the liquid crystal display panel manufactured by using the aforementioned circuit layout can be compared with the liquid crystal display panel of the prior art in FIG. 3. Two electrode layers 50 between the adjacent gate lines 30 and the adjacent data lines 32, respectively, form display regions of two pixels. In the design of the present invention, the common line 36 may not shield an area of the transmissive region of the electrode layer 50. Further, for a same number of thin film transistors, the number of common lines 36 used in FIG. 4 is less than the number used in FIG. 3. For example, two common lines are required in the present invention for eight thin film transistors, but three common lines are required in the prior art. In other words, the aperture ratio of the pixel can be raised according to the aforementioned design of the present invention.

Figure 8:
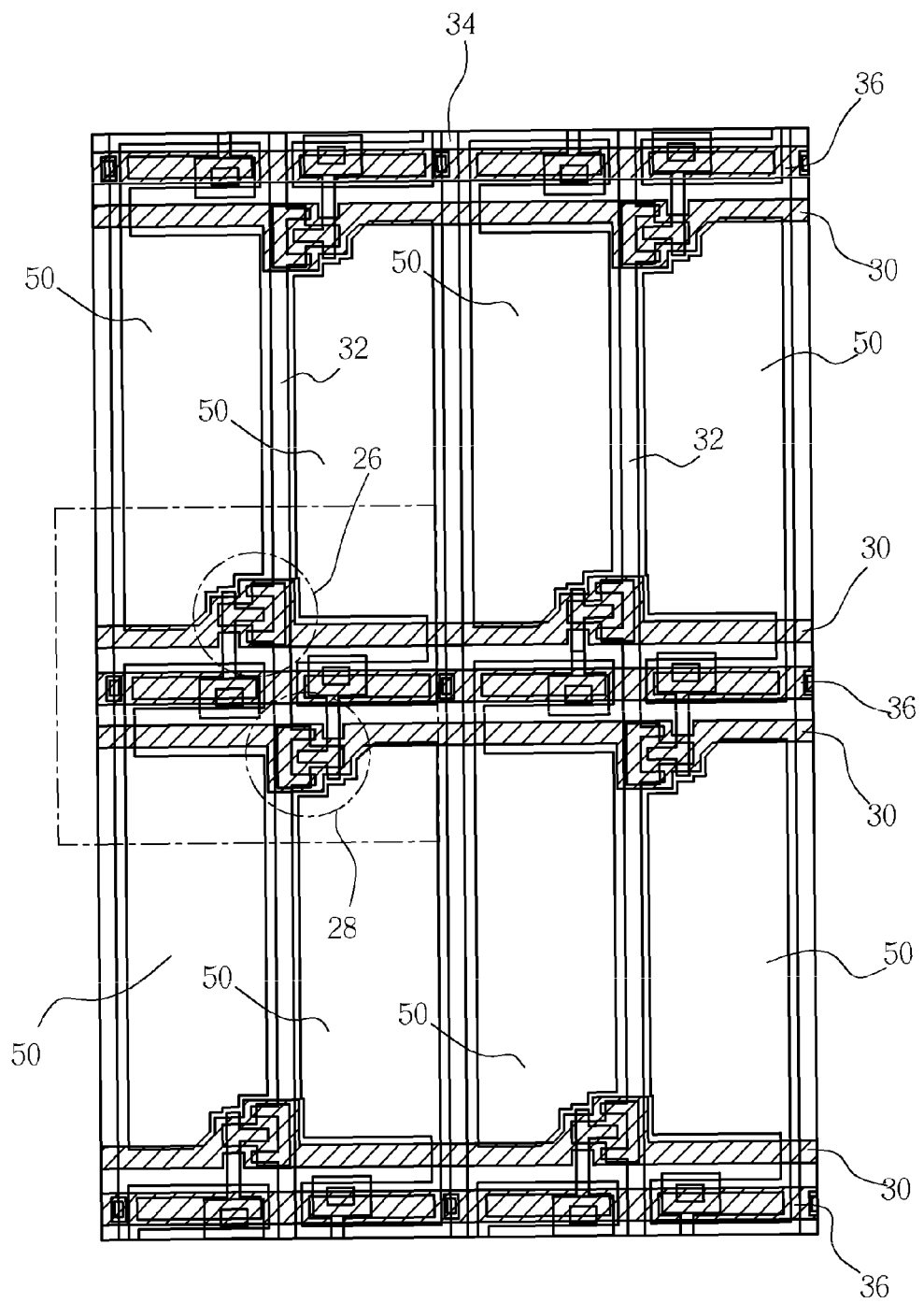
FIG. 8 is a schematic diagram illustrating a circuit layout structure of a liquid crystal display panel according to a second embodiment of the present invention.
Figure 9:
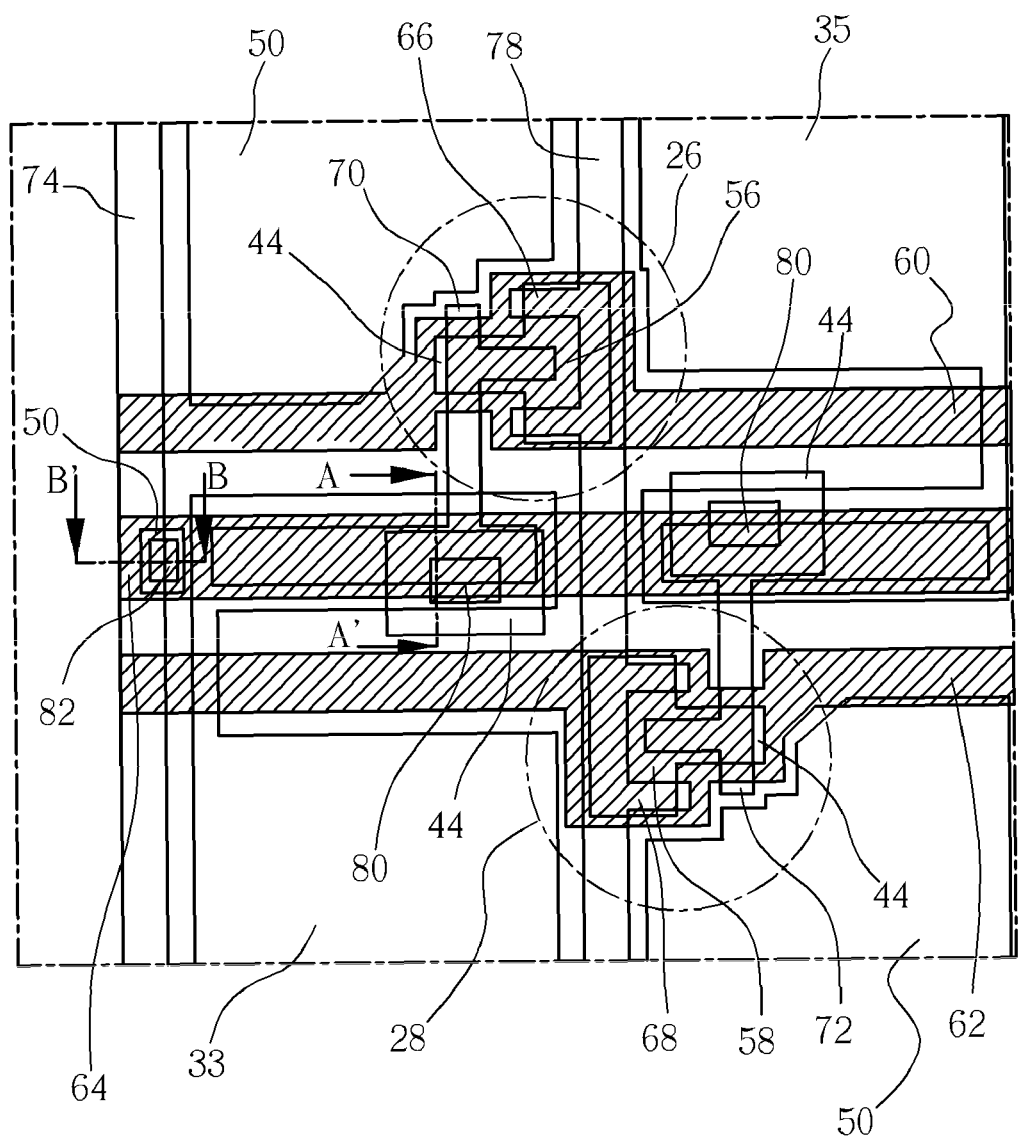
FIG. 9 is a sectional enlarged schematic diagram illustrating a circuit layout structure of the liquid crystal display panel according to a second embodiment of the present invention.

Next, please refer to a circuit layout of a second embodiment shown in FIG. 8 and FIG. 9. The electrode layer 50 at a lateral side of the first thin film transistor 26 partially overlaps the first gate line 60 which is disposed at a lateral side of the drain electrode 70 of the first thin film transistor 26. The electrode layer 50 at a lateral side of the second thin film transistor 28 partially overlaps the second gate line 62 which is disposed at a lateral side of the drain electrode 72 of the second thin film transistor 28. For this reason, the light shielding layer is not required to be disposed between the color filters corresponding to the edge of the electrode layer at a lateral side of each thin film transistor. The area of the storage capacitor may also be increased in this design to reduce the probability of flicker.

Figure 10:
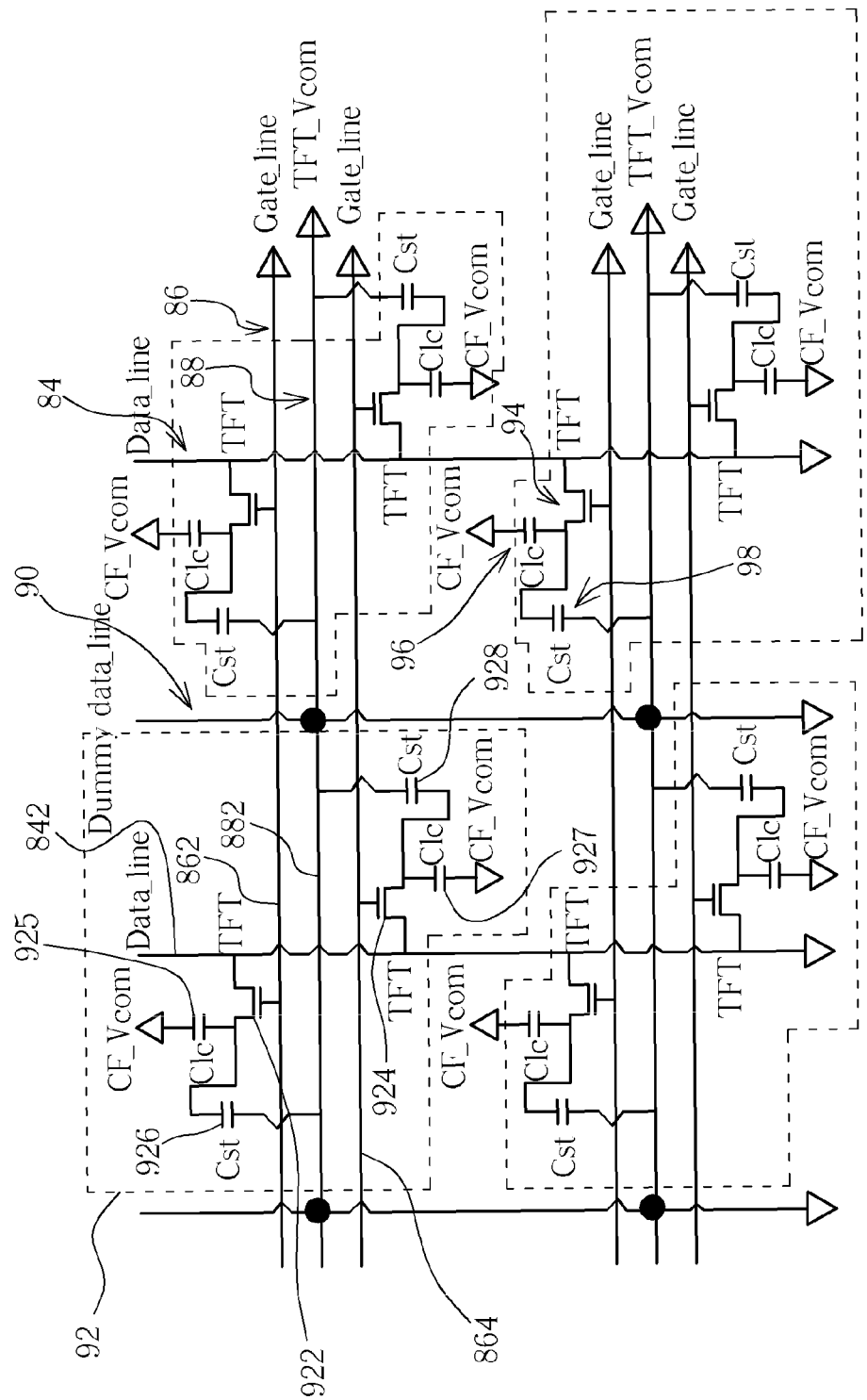
FIG. 10 is a circuit diagram of a liquid crystal display panel according to the present invention.

Please refer to an equivalent circuit diagram of a liquid crystal display panel of the present invention in FIG. 10. As shown in FIG. 10, the equivalent circuit of the liquid crystal display panel of the present invention includes a plurality of gate lines 86 parallel to each other and a plurality of data lines 84 parallel to each other. The gate lines 86 include a first gate line 862 and a second gate line 864, and are perpendicular to the data lines 84 and are parallel to a plurality of common lines 88. The data lines 84 include a first data line 842. The common lines 88 include a first common line 882.

The liquid crystal display panel of the present invention further includes a plurality of dual-gate pixel units 92 arranged in a matrix and connected to each other through the data lines 84, the gate lines 86 and the common lines 88. Each dual-gate pixel unit 92 is electrically connected to a data line 84, two gate lines 86 and a common line 88. The dual-gate pixel units 92 in a same column share a same data line 84, and the dual-gate pixel units 92 in a same row share a same gate line 86 and a same common line 88. The components of each dual-gate pixel unit 92 have the same connecting relationships and relative positions. The present invention takes one dual-gate pixel unit 92 as an example, and the connecting relationships and the relative positions among the first gate line 862, the second gate line 864, the first data line 842, the first common line 882 and a dual-gate pixel unit 92 are mentioned in the following description.

Figure 11:
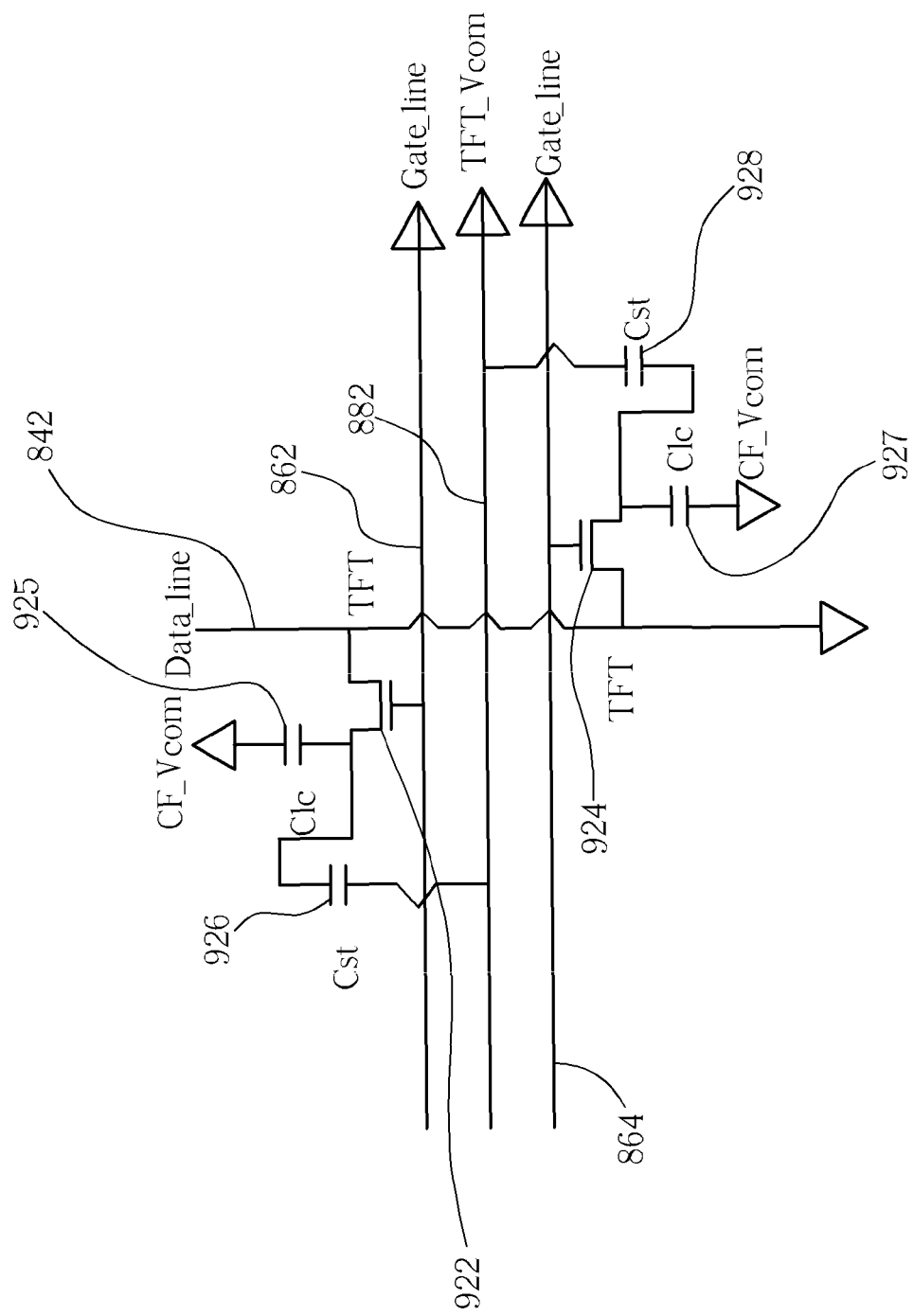
FIG. 11 is a circuit diagram of a dual-gate pixel unit of the present invention.

Please refer to FIG. 10 and FIG. 11 together. Each dual-gate pixel unit 92 includes a first thin film transistor 922, a first liquid crystal capacitor 925 and a first storage capacitor 926 correspondingly connected to the first thin film transistor 922. Each dual-gate pixel unit 92 further includes a second thin film transistor 924, and a corresponding second liquid crystal capacitor 927 and a second storage capacitor 928 correspondingly connected to the second thin film transistor 924. The first thin film transistor 922 and the corresponding first liquid crystal capacitor 925 and the corresponding first storage capacitor 926 connected to the first thin film transistor 922 are disposed at one lateral side of the first gate line 862 and the second gate line 864, and the second thin film transistor 924 and the corresponding second liquid crystal capacitor 927 and the corresponding second storage capacitor 928 connected to the second thin film transistor 924 are disposed at the other lateral side of the first gate line 862 and the second gate line 864 opposite to the one lateral side of the first gate line 862 and the second gate line 864. The first thin film transistor 922 and the corresponding first liquid crystal capacitor 925 and the corresponding first storage capacitor 926 connected to the first thin film transistor 922 and the second thin film transistor 924 and the corresponding second liquid crystal capacitor 927 and the corresponding second storage capacitor 928 connected to the second thin film transistor 924 are respectively disposed at two opposite sides of the first data line 842. The first gate line 862 and the second gate line 864 are disposed at two opposite sides of the first common line 882, and the first common line 882 is disposed at a region between the first gate line 862 and the second gate line 864.

A gate electrode of the first thin film transistor 922 is electrically connected to the first gate line 862, and a source electrode of the first thin film transistor 922 is electrically connected to the first data line 842. A drain electrode of the first thin film transistor 922 is electrically connected to an end of the first liquid crystal capacitor 925 and an end of the first storage capacitor 926. The other end of the first liquid crystal capacitor 925 is connected to a common electrode of a color filter for receiving a first common voltage signal, and the other end of the first storage capacitor 926 is connected to the first common line 882. The first data line 842 and the first common line 882 respectively transfer a data signal and a second common voltage signal to the first thin film transistor 922, and the first gate line 862 controls the first thin film transistor 922 to receive the data signal, so that charging/discharging of the first liquid crystal capacitor 925 is controlled. The first storage capacitor 926 is utilized to hold a voltage drop between two ends of the first liquid crystal capacitor 925 in order to prevent current leakage of the first liquid crystal capacitor 925.

Similarly, a gate electrode of the second thin film transistor 924 is electrically connected to the second gate line 864, and a source electrode of the second thin film transistor 924 is electrically connected to the first data line 842. A drain electrode of the second thin film transistor 924 is connected to an end of the second liquid crystal capacitor 927 and an end of the second storage capacitor 928. The other end of the second liquid crystal capacitor 927 is connected to the common electrode of the color filter for receiving the first common voltage signal, and the other end of the second storage capacitor 928 is connected to the first common line 882. The first data line 842 and the first common line 882 respectively transfer the data signal and the second common voltage signal to the second thin film transistor 924, and the second gate line 864 controls the second thin film transistor 924 to receive the data signal, so that charging/discharging of the second liquid crystal capacitor 927 is controlled. The second storage capacitor 928 is used to hold a voltage drop between two ends of the second liquid crystal capacitor 927 in order to prevent current leakage of the second liquid crystal capacitor 927.

The liquid crystal display panel further includes a plurality of dummy lines 90. Each one of the dummy lines 90 is respectively disposed between two adjacent dual-gate pixel units 92 in the same row and is connected to the common line 88. In the process of transferring the second common voltage signal via the second common line 88, the second common voltage signal in the center region of the liquid display panel is unstable. The common lines 88 are connected to the dummy lines 90 to improve the stability of the second common voltage signal.

Figure 1:
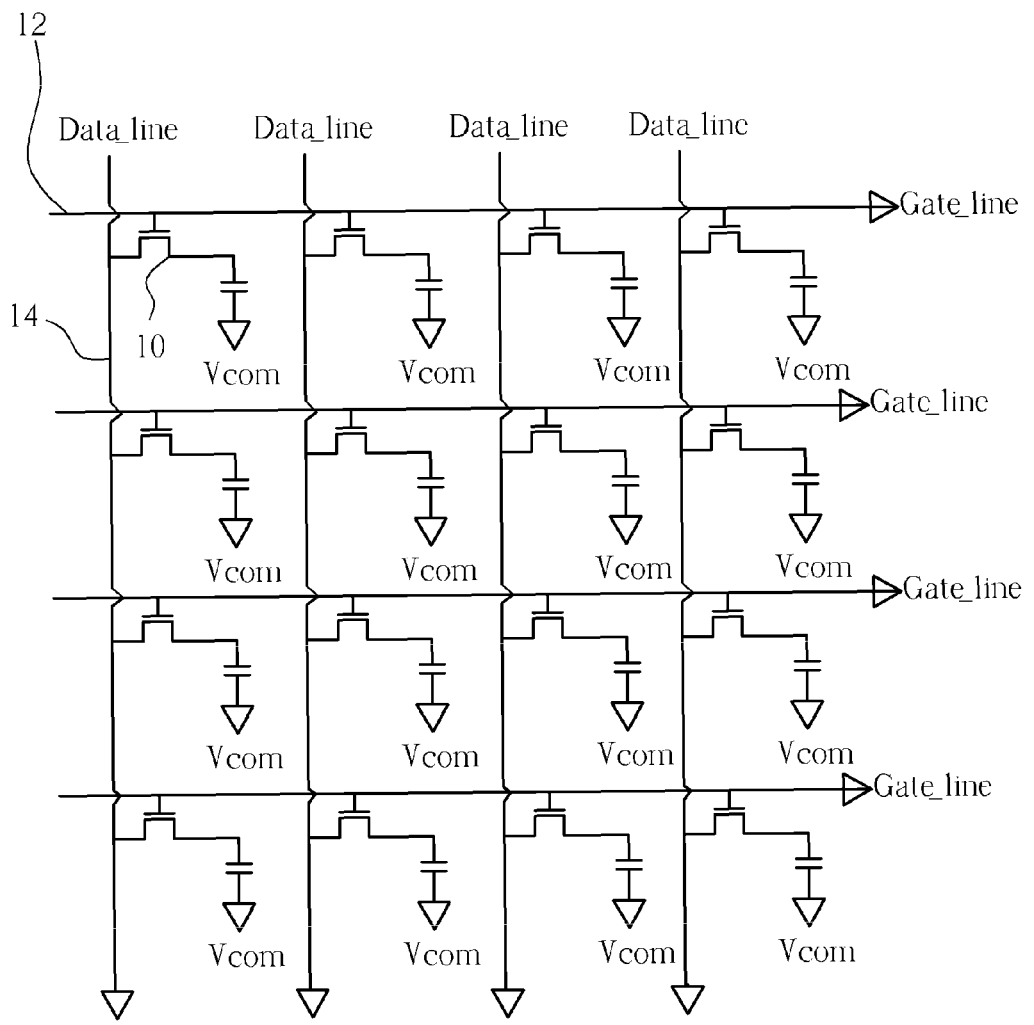
FIG. 1 and FIG. 2 are circuit diagrams of display panels according to the prior art.
Figure 2:
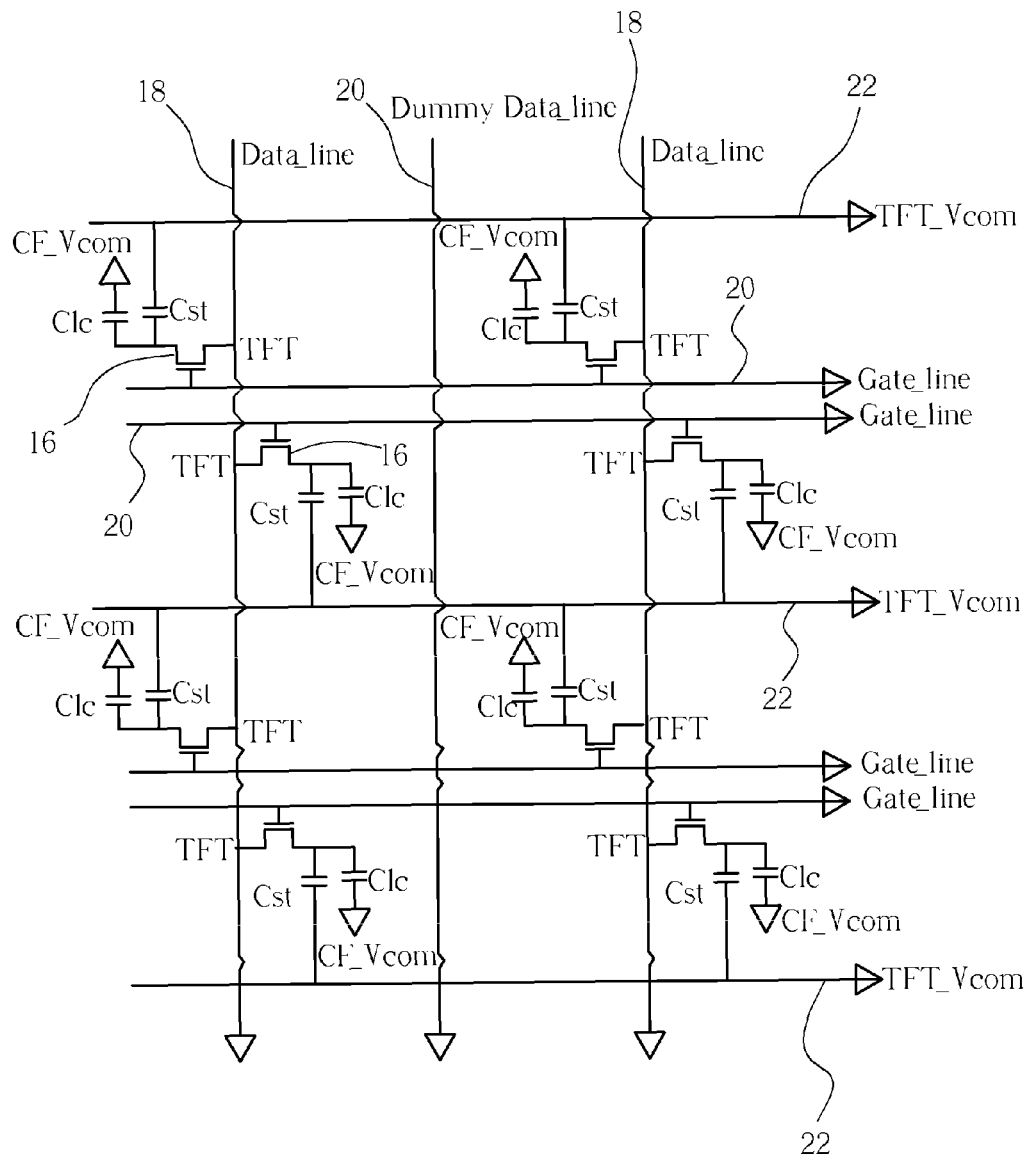

FIG. 10 can be compared with FIG. 2 of the prior art. For the same number of thin film transistors, the number of common lines in FIG. 10 is less than that in FIG. 2, which is a similar result as when comparing circuit layouts. In other words, the design of the present invention raises the aperture ratio of the pixel. The design of the circuit layout structure may be applied to pixel design for vertical alignment type (VA type), twisted nematic type (TN type), and in-plane switching type (IPS type) liquid crystal structures, or to pixel design of organic film.

Please refer to FIG. 10 again. Operation of the liquid crystal display panel of the present invention is described in the following. First, each common line 88 and each data line 84 respectively transfers a first common voltage signal and a data signal to the storage capacitor 98 connected to the common line 88 and the thin film transistor 94 connected to the data line 84, and each liquid crystal capacitor 96 receives a first common voltage signal. Since each common line 88 is respectively connected to the dummy line 90, the second common voltage signal in each common line 88 is rather stable. Next, the gate lines 86 from top to bottom respectively control the corresponding thin film transistors 94 in each row to receive the data signal, so that charging/discharging of the liquid crystal capacitor 96 is controlled. Also, the storage capacitor 98 connected to the liquid crystal capacitor 96 is utilized to hold the voltage drop between two ends of the liquid crystal capacitor 96.

Figure 12:
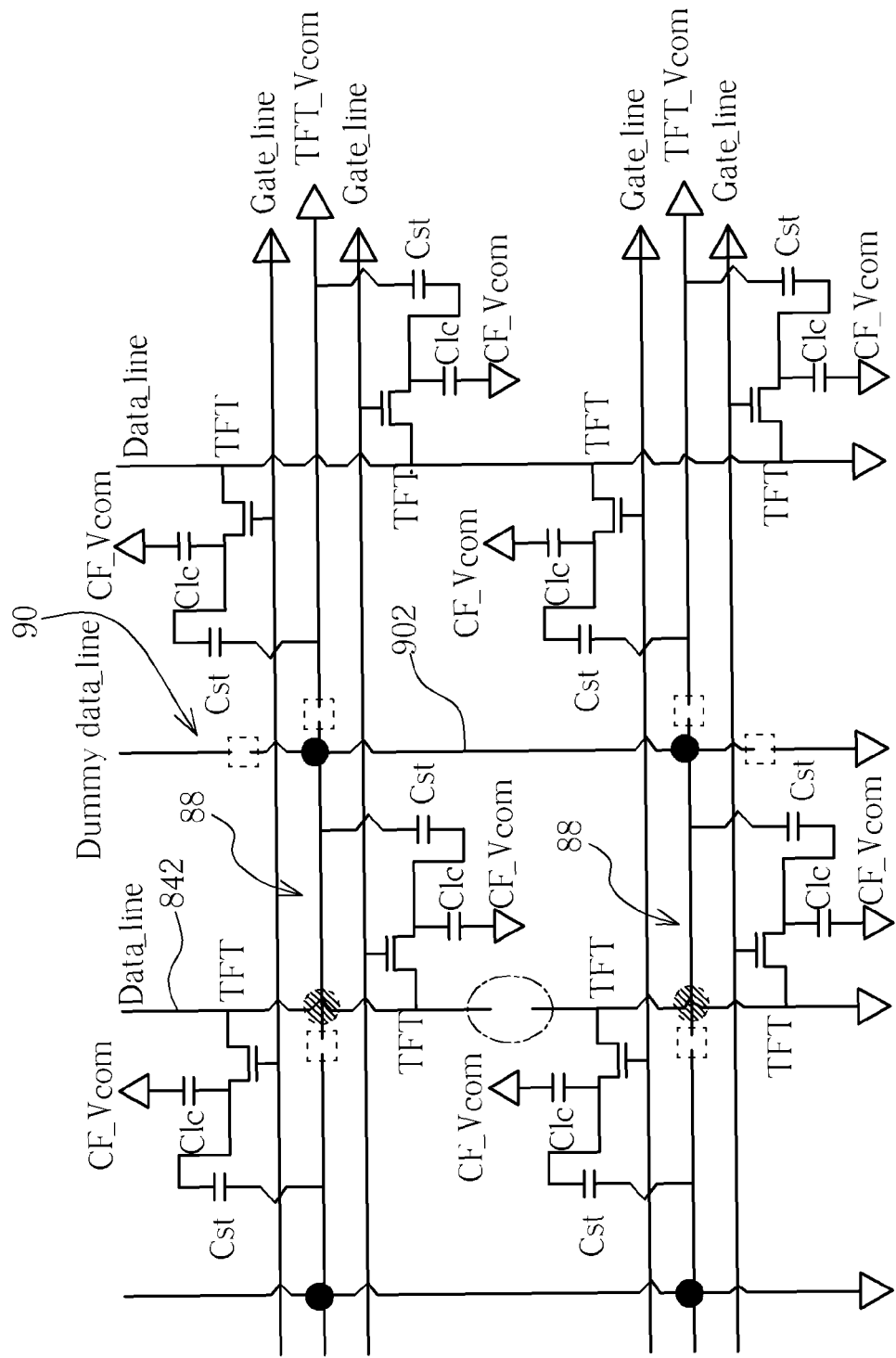
FIG. 12 is a circuit diagram of a liquid crystal display panel after laser repairing according to the present invention.

Finally, please refer to FIG. 12. The design of the circuit structure of the liquid crystal display panel described above has another advantage. When the data line 842 is disconnected, the lines may be cut off by a laser at locations marked by square blocks (dotted lines), and the first data line 842 and the common line 88 can be connected to each other by a laser at a location marked by an oval (dotted line). Accordingly, the first dummy line 902 can be utilized to take the place of the disconnected data line 842, and product yield can be improved.

In conclusion, the present invention not only increases the aperture ratio of the pixel in the panel, but also provides better stability in the common voltage signal by electrically connecting the common line to the dummy line.

Those skilled in the art will readily observe that numerous modifications and alterations of the device and method may be made while retaining the teachings of the invention.

What is claimed is:
1. A pixel electrode structure comprising:
  a transparent substrate;
  a data line disposed on the transparent substrate;
  a common line disposed on the transparent substrate;
  a first array pixel disposed on the transparent substrate, the first array pixel comprising a first thin film transistor having an extending portion, a first pixel electrode, a first gate line, and a portion of the common line disposed at a lateral side of the first gate line;
  a first via hole disposed on the common line and in contact with the extending portion of the first thin film transistor;
  a second array pixel disposed on the transparent substrate, the second pixel array comprising a second thin film transistor having an extending portion, a second pixel electrode, a second gate line, and another portion of the common line being disposed at a lateral side of the second gate line;
  a second via hole disposed on the common line and in contact with the extending portion of the second thin film transistor;
  a dummy line disposed at a side of the data line; and
  a third via hole disposed both on the dummy line and on the common line.

2. The pixel electrode structure of claim 1, wherein the common line is disposed at a region between the first gate line and the second gate line.

3. The pixel electrode structure of claim 1, wherein the first pixel electrode includes a portion disposed at a lateral side of the first gate line, and the portion of the first pixel electrode overlaps the common line and the second gate line.

4. The pixel electrode structure of claim 3, wherein the common line is overlapped with the portion of the first pixel electrode to form a first overlapping area, the second gate line is overlapped with the portion of the first pixel electrode to form a second overlapping area, and the second overlapping area is less than the first overlapping area.

5. The pixel electrode structure of claim 1, wherein the second pixel electrode includes a portion disposed at a lateral side of the second gate line, and the portion of the second pixel electrode overlaps the common line and the first gate line.

6. The pixel electrode structure of claim 5, wherein the common line is overlapped with the portion of the second pixel electrode to form a third overlapping area, the first gate line is overlapped with the portion of the second pixel electrode to form a fourth overlapping area, and the fourth overlapping area is less than the third overlapping area.

7. The pixel electrode structure of claim 1, wherein each of the first thin film transistor and the second thin film transistor respectively comprises a source electrode, a drain electrode, and a gate electrode.

8. The pixel electrode structure of claim 7, wherein the extending portion of the first thin film transistor in contact with the first via hole is the drain electrode, and the extending portion of the second thin film transistor in contact with the second via hole is the drain electrode.

9. The pixel electrode structure of claim 1, wherein each of the first array pixel and the second array pixel includes a structure having a first metal layer, an insulating layer, a semiconductor layer, a second metal layer, a passivation layer, and an electrode layer.

10. The pixel electrode structure of claim 9, wherein the electrode layer partially overlaps both the first gate line disposed at a lateral side of the drain electrode of the first thin film transistor, and the second gate line disposed at a lateral side of the drain electrode of the second thin film transistor.

11. The pixel electrode structure of claim 9, wherein the first via hole and the second via hole are both formed on a portion of the second metal layer and on a portion of the semiconductor layer, so that the electrode layer is connected to the portion of the second metal layer and the portion of the semiconductor layer.

12. The pixel electrode structure of claim 1, wherein the first thin film transistor and the second thin film transistor are disposed on two opposite sides of the data line, the first thin film transistor is disposed at one lateral side of the first gate line and the second gate line, and the second thin film transistor is disposed at the other lateral side of the first gate line and the second gate line opposite to the one lateral side of the first gate line and the second gate line.

13. The pixel electrode structure of claim 1, wherein the third via hole is formed both on a portion of the dummy line and a portion of the common line, and the electrode layer includes an independent part electrically connecting the dummy line to the common line.

* * * * *